United States Patent [19]
Mamet et al.

[11] 4,424,490
[45] Jan. 3, 1984

[54] HIGH VOLTAGE PROBE FOR GAS INSULATED HIGH VOLTAGE SWITCHING INSULATION

[75] Inventors: Manfred Mamet; Dietrich Fischer; Gerhard Tuemmler; Detlev Niederhuefner, all of Berlin, Fed. Rep. of Germany

[73] Assignee: Siemens AG, Berlin and Munich, Fed. Rep. of Germany

[21] Appl. No.: 287,911

[22] Filed: Jul. 29, 1981

[30] Foreign Application Priority Data

Aug. 4, 1980 [DE] Fed. Rep. of Germany ....... 3029778

[51] Int. Cl.$^3$ .............................................. G01R 31/02
[52] U.S. Cl. ..................................... 324/424; 324/72.5; 324/107; 324/126
[58] Field of Search ....................... 324/424, 415, 72.5, 324/457, 107, 126; 361/281

[56] References Cited

U.S. PATENT DOCUMENTS 4,087,744 5/1978 Olsen .................................... 324/126

FOREIGN PATENT DOCUMENTS

| 2155398 | 4/1973 | Fed. Rep. of Germany ...... 324/424 |
| 2325445 | 12/1974 | Fed. Rep. of Germany ...... 324/126 |
| 2647106 | 5/1977 | Fed. Rep. of Germany ...... 324/126 |
| 56-103370 | 8/1981 | Japan .................................. 324/126 |

*Primary Examiner*—Michael J. Tokar
*Assistant Examiner*—Kevin D. O'Shea
*Attorney, Agent, or Firm*—Karl F. Milde, Jr.; Andrew G. Rodau

[57] ABSTRACT

In a metal-clad, compressed gas-insulated high-voltage switching installation, installation parts can be cut off by a circuitbreaker and connected to the grounded casing by means of a grounding switch, insulated measuring electrodes connectable to the testing terminal of a capacitive voltage divider and to a display device being provided in the casing adjacent to the grounding switch, for observation of the conductor voltage.

To obtain a simple test setup in a three-phase clad installation, two pin-type measuring electrodes are arranged respectively centrally between pairs of the three conductors in such a way that their rounded end protrudes into the interior of the casing.

6 Claims, 2 Drawing Figures

HIGH VOLTAGE PROBE FOR GAS INSULATED HIGH VOLTAGE SWITCHING INSULATION

BACKGROUND OF THE INVENTION

The invention relates to a metal-clad, compressed gas-insulated high-voltage switching installation, wherein installation parts can be cut off by circuit-breakers and can be connected with the grounded casing by means of a grounding switch and wherein insulated measuring electrodes connectable to the testing terminal of a capacitive voltage divider and to a display device are provided in the casing adjacent to the grounding switch for observation of the conductor voltage.

Such an installation is known from a German published patent application DE-OS 21 55 398. It is described therein that for simple recognition of the cutoff state of an isolated installation part a capacitive voltage reading is taken in the interior of the casing. This is done with the aid of a measuring electrode which is disposed insulated in the casing adjacent to the grounding switch. The measuring electrode is of annular design and embraces or surrounds the movable stud of the grounding switch without making contact therewith. Hence one measuring electrode per phase of grounding switch is provided.

SUMMARY OF THE INVENTION

It is an object of this invention to reduce the cost of such a determination of the cutoff state of installation parts with the aid of a capacitive voltage measurement. To solve this problem, according to this invention, in a three-phase metal-clad, compressed gas-insulated high-voltage switching installation of the above-described kind, two pin-type measuring electrodes within a housing are arranged each respectively centrally between two of the three conductors, in such a way that their rounded end protrudes into the interior of the casing.

Such a measuring arrangement has the advantage that the voltage-free or voltage-carrying state of a three-phase clad installation can be unambiguously established with only two measuring electrodes. By the pin-type form of the measuring electrode with rounded end, which moreover protrudes only a small distance into the interior of the casing, the electric field prevailing in the interior of the casing is minimally distorted. The pin-type measuring electrodes are arranged respectively centrally between pairs of the three conductors, i.e., at a free point in the wall of the casing. Different grounding switches may be used. In the case of a star ground the measuring electrode is located in the sheath wall of the casing, i.e., at the limitation of the gas-filled space, and protrudes radially into the high-voltage space. In the case of a parallel ground, the measuring electrode is located on the drive plate for the grounding switches, i.e., inside the gas-filled space, and protrudes axially into the high-voltage space.

To make the data pickup required for the measurement easy to mount at the transition from the gas-filled space inside the casing to the exterior and to give it a compact form, the pin-type measuring electrode is advantageously inserted under insulation in the end wall of a cylindrical metallic housing which is conductively connected with the casing wall, the other end of the measuring electrode being connected with the testing terminal, lying in a cavity of the housing hermetically sealed from the casing. It is further advisable to close the cavity by an end wall into which a coaxial jack connected with the measuring electrode via a plug contact is inserted, which jack can be grounded via a shortcircuiting cap. In this way the cavity inside the housing is available for receiving the plug junction and any protection means that may be necessary, and there protrudes from the end wall only the coaxial jack for the connection to the actual measuring arrangement, i.e., the display device. As the voltage measurement for checking the cutoff state of the installation parts is necessary only at certain times, during normal operation a perfect grounding of this part of the measurement arrangement inserted in the casing is obtained by the short-circuiting cap.

For the case of parallel grounds, where the measuring electrode itself lies inside the gas-filled space, it is expedient to use a similarly constructed housing for passage through the casing wall. It then suffices to augment the pin-type measuring electrode inserted in the lower end wall by a junction part of the same dimensions which permits on both sides the connection of a shielded coaxial test cable. On the exterior of the housing the connection between the pin-type measuring electrode in the gas-filled space and this junction part is effected by means of a shielded coaxial test cable.

DESCRIPTION OF THE PREFERRED EMBODIMENTS

Figure 1:
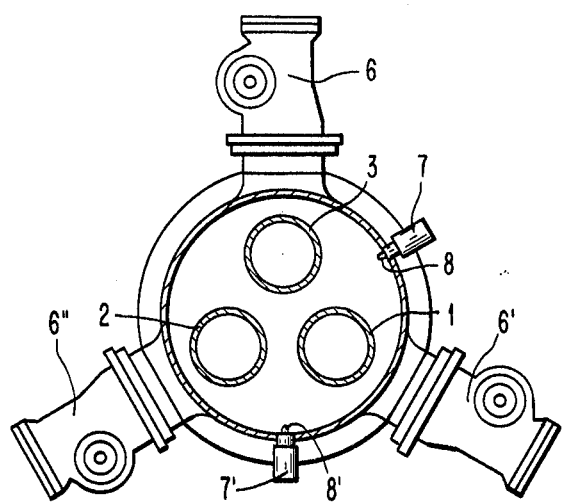
FIG. 1 shows schematically a section through a three-phase metal-clad high-voltage switching installation with star ground.

In a three-phase, metal-clad compressed gas-insulated high-voltage switching installation, the three conductors 1, 2, 3 of the three phases of the system lie in circumferential-symmetrical arrangement in the interior 4 of the metallic grounded casing 5. Each conductor 1, 2, 3 has correlated with it a grounding switch 6 of a star ground, by which the installation part can be grounded after voltage-cutoff.

This grounding may be effected only after the voltage-free state of the installation part has been definitely established. To this end, two data pickups 7 with pin-type measuring electrodes 8 are disposed in the casing 5 centrally between two of the three conductors 1, 2, or respectively 3, 1, in such a way that rounded ends of the measuring electrodes 8 protrude into the interior 4 of casing 5. These data pickups 7 can be connected in any well-known manner with the terminal of any well-known suitable display device. The measuring electrodes 8 pick up either the presence of a voltage or a voltage-free state, so that one obtains a clear picture of the state of the installation part.

In the case of the star ground, the measuring electrodes 8 lie under insulation in the sheath wall of casing 5, i.e., between the gas-filled interior 4 in casing 5 and the exterior thereof. The data pickup 7, therefore, has provision for hermetically connecting the shielded coaxial cable leading to the display device.

Figure 2:
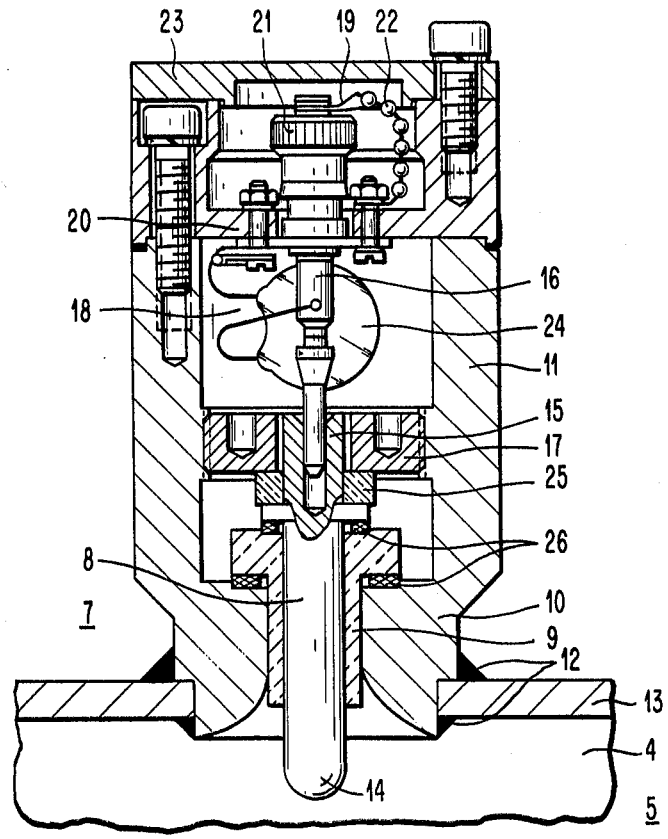
In FIG. 2 is a sectional view showing details of a data pickup or measuring electrode inserted in the sheath wall of the casing.

FIG. 2 shows specifically the data pickup 7 with respect to its structural design.

The pin-type measuring electrode 8, insulated through an insulator 9, is inserted in the lower end wall 10 of a cylindrical metallic housing 11, which is conductively connected with the casing wall 13, for instance, through weld seams 12. The end 14 of the measuring electrode 8, is rounded in hemispherical form, which protrudes into the interior 4 of casing 5. To be able, on the one hand, to pick up an unambiguous measured value, while on the other, disturbing or distorting the electric field in the interior of the casing 5 as little as possible, it suffices that the rounded end 14 protrudes approximately 20 mm into the interior 4 of the casing.

The other end 15 of the measuring electrode 8, to be connected to the testing terminal 16, lies in a cavity 18 of housing 11 which is hermetically sealed from the casing 5 by a thrust nut 17, an insulated spacer ring 25, and seal rings 26. The testing terminal 16 to the measuring electrode 8 is formed as a plug contact and leads to a coaxial jack 19 inserted in the upper end wall 20, which closes the cavity 18. Since the measurements need to be carried out only at certain times, i.e., very rarely—as compared with the total operating time of the installation—a shortcircuiting cap 21 is provided, fastened by a chain 22 movably but captively on the end wall 20. By this shortcircuiting cap 21 the coaxial jack 19 is closed and grounded during the periods in which no measurement is made. In addition, the outer end of data pickup 7 is protected by a cover 23.

The data pickup 7 also is equipped with a varistor 24 for protection against overvoltages. The varistor 24 is disposed physically in the cavity 18 electrically between the measuring electrode 8 and ground.

The data pickup 7 thus constructed results in a very compact design and favorable form of realization with respect to the hermetic lead-out between the high-voltage space and the data pickup 7. Insertion of the data pick-up 7 into the casing wall 13 is easy to carry out.

On the other hand, if the measuring electrode 8 as a whole lies inside the gas space of casing 5, as may be the case with a parallel ground, it is likewise possible to use a data pickup 7 of identical design for the passage of the measuring arrangement through the casing wall 13; it is then necessary merely to provide, on the side of the measuring electrode 8 toward the interior 4 of casing 5, means for a coaxial test cable connection which establishes the connection to the measuring electrode 8 lying in the gas space.

What is claimed is:

1. In a metal-clad, compressed gas-insulated high-voltage switching three-phase installation having three conductors within a casing, wherein installation parts can be cut off electrically by circuit breakers and can be connected with the grounded casing by means of a grounding switch, two pin-type insulated measuring electrodes provided in the casing adjacent to said grounding switch, means connected to said electrodes for transmitting an indication of the presence or absence of conductor voltage within said casing, said measuring electrodes being positioned respectively centrally between different pairs of the three conductors, one end respectively of said electrodes protruding into the interior of said casing.

2. A high-voltage switching installation according to claim 1, characterized in that the ends of the measuring electrodes are rounded in hemispherical form.

3. A high-voltage switching installation according to claim 1 or 2, characterized in that said ends protrude into the interior of the casing approximately 20 mm.

4. In a metal-clad, compressed gas-insulated high-voltage switching three-phase insulation having three conductors within a casing, wherein installation parts can be cut off electrically by circuit breakers and can be connected with a grounded casing by means of a grounding switch, two pin-type insulated measuring electrodes provided in the casing adjacent to said grounding switch, means connected to said electrodes for transmitting an indication of the presence of absence of conductor voltage within said casing, said measuring electrodes being positioned respectively centrally between different pairs of the three conductors, one end respectively of said electrodes protruding into the interior of said casing, characterized in that each said pin-type measuring electrode is positioned respectively under installation in the lower end wall of the cylindrical metallic housing, each said housing having a cavity and being conductively connected with the wall of said casing, a testing terminal within each said cavity, the other end of each said measuring electrode being connected to a respective said testing terminal, each said cavity being hermetically sealed from said casing.

5. A high-voltage switching installation according to claim 4, characterized in that a varistor is arranged within each said cavity, each said varistor being electrically connected between the respective said measuring electrode and ground.

6. A high-voltage switching installation according to claim 4 or 5, characterized in that each said cavity is closed by an end wall in each said housing, a coaxial jack for external connection, said jack extending through said end wall, and being connected respectively to a said testing terminal, and a short-circuiting cap on said jack for rendering said terminal inoperable during periods of non-use.

* * * * *